(12) United States Patent
Nakayama et al.

(10) Patent No.: US 7,567,083 B2
(45) Date of Patent: Jul. 28, 2009

(54) SUPERCONDUCTIVE MAGNETIC APPARATUS FOR MAGNETIC RESONANCE IMAGING UNIT

(75) Inventors: Takeshi Nakayama, Hitachinaka (JP);
Mitsushi Abe, Hitachinaka (JP);
Hiroyuki Watanabe, Hitachi (JP);
Masanori Takahashi, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/723,749

(22) Filed: Mar. 21, 2007

(65) Prior Publication Data
US 2008/0100295 A1 May 1, 2008

Related U.S. Application Data

(63) Continuation of application No. 11/240,394, filed on Oct. 3, 2005, now abandoned.

(30) Foreign Application Priority Data
Oct. 4, 2004 (JP) ............................. 2004-291758

(51) Int. Cl.
*G01V 3/00* (2006.01)
(52) U.S. Cl. ..................................... 324/318
(58) Field of Classification Search .................. 324/318
See application file for complete search history.

(56) References Cited

U.S. PATENT DOCUMENTS

| 5,874,880 A * | 2/1999 | Laskaris et al. ............. 335/216 |
| 5,874,882 A | 2/1999 | Laskaris et al. |
| 5,883,558 A * | 3/1999 | Laskaris et al. ............. 335/216 |
| 5,994,991 A | 11/1999 | Laskaris et al. |
| 5,999,075 A | 12/1999 | Laskaris et al. |

(Continued)

FOREIGN PATENT DOCUMENTS

CN 1523369 8/2004

(Continued)

OTHER PUBLICATIONS

R.M. Bozorth.: Ferromagnetism (D. Van Nostrand, Princeton, NJ 1951), p. 849.

(Continued)

*Primary Examiner*—Brij B Shrivastav
*Assistant Examiner*—Megann E Vaughn
(74) *Attorney, Agent, or Firm*—Dickstein Shapiro LLP

(57) ABSTRACT

A super-conducting magnet apparatus in an MRI system which may reduce unevenness among magnetization characteristics of ferromagnetic elements arranged between super-conductive shield coils and superconducting main coils. There are provided a pair of super-conducting main coils, a pair of superconductive shield coils arranged on the axes of the pair of super-conducting main coils, being spaced from the pair of super-conducting main coils, and also arranged on opposite sides of a zone to be observed, and ferromagnetic elements arranged in parts of spaces extending from air core parts of the super-conducting main coils to air core parts of the super-conductive shield coils. The super-conductive shield coils have an outer diameter which is larger than that of the super-conducting main coils. The ferromagnetic elements are composed of a plurality of axially symmetric ferromagnetic members which are coaxially arranged, and which have a space in at least a radial part thereof, but not in a center axis part. With this configuration, the magnetic saturation of the ferromagnetic members may be facilitated. Thereby it is possible to reduce the effect of unevenness among magnetization characteristics of the ferromagnetic elements.

7 Claims, 6 Drawing Sheets

U.S. PATENT DOCUMENTS

| | | |
|---|---|---|
| 6,335,670 B1 * | 1/2002 | Kinanen ................ 335/296 |
| 6,570,475 B1 | 5/2003 | Lvovsky et al. |
| 2004/0041673 A1 | 3/2004 | Kakugawa et al. |
| 2004/0100261 A1 | 5/2004 | Laskaris et al. |

FOREIGN PATENT DOCUMENTS

| | | |
|---|---|---|
| EP | 0 940 687 | 9/1999 |
| JP | A-9-223620 | 8/1997 |
| JP | A-11-283823 | 10/1999 |
| JP | A-11-318858 | 11/1999 |
| JP | A-2003-513436 | 5/2001 |
| JP | A-2001-224571 | 8/2001 |
| JP | A-2003-512872 | 4/2003 |

OTHER PUBLICATIONS

Patent Abstracts of Japan, vol. 2000, No. 25, Apr. 12, 2001.

European Search Report, Feb. 24, 2006.

* cited by examiner

SUPERCONDUCTIVE MAGNETIC APPARATUS FOR MAGNETIC RESONANCE IMAGING UNIT

CROSS-REFERENCE TO RELATED APPLICATIONS

This application is a continuation of U.S. patent application Ser. No. 11/240,394, filed on Oct. 3, 2005 now abandoned, the subject matter of which is incorporated in its entirety by reference herein.

BACKGROUND OF THE INVENTION

The present invention relates to a superconducting magnet apparatus in a magnetic resonance imaging system.

A magnetic resonance imaging (MRI) system is adapted to apply a high frequency magnetic field to a test object located in a static magnetic field so as to excite, for example, hydrogen nuclei in order to measure electromagnetic waves emitted by hydrogen nuclear spins due to a nuclear magnetic resonance (which will be referred to as "NMR") phenomenon. Then, measurement signals thereof are computed so as to create an image of a density distribution of the hydrogen nuclei in the test object which can contribute to a diagnosis for the test object. That is, in order to determine a tomography of the test object at a desired position using the MRI system, a homogenous static magnetic field in a zone to be observed is superposed thereover with an angled magnetic field for exhibiting positional data of a measurement space so as to set a predetermined magnetic field intensity in a slice cut surface having a thickness of, for example, 1 mm. Next, an electromagnetic wave having a resonance frequency is applied to the zone in order to induce an NMR phenomenon in the slice so as to generate electromagnetic waves emitted by the hydrogen nucleus ions in order to create an image.

In general, a static magnetic field in the zone to be observed in which the test object is set, requires a high static magnetic field intensity (for example, not less than 0.2 T) and a high static magnetic field uniformity (for example, about 10 ppm).

Conventionally, various electromagnet apparatuses for MRI systems have been proposed. For example, an electromagnet apparatus disclosed in U.S. Pat. No. 6,540,476 is composed of a super-conducting main coils which are opposed to each other interposing therebetween the zone to be observed. Further, in order to cancel magnetic flux induced by the pair of super-conducting main coils on the opposite sides of the zone to be observed, super-conducting shield coils having a diameter larger than that of the super-conducting coils are provided, the super-conducting shield coils being outside of and spaced from the super-conducting main coils along the axes of the super-conducting main coils. That is, the super-conducting shield coils use a current flow that is opposite in direction to the current flow in the super-conducting coils so as to cancel the magnetic flux induced on the opposite sides of the zone to be observed.

Since the intensity of the electromagnetic wave emitted by a hydrogen nucleus spin is proportional to a static magnetic field intensity, the static magnetic field intensity is increased in order to enhance the resolution of an image. In the electromagnet apparatus, in order to increase the static magnetic field intensity in a zone to be observed, both current running through the super-conducting main coils and current running through the super-conducting shield magnets is increased. As the currents running through both superconducting coils are increased, the magnetic flux passing through a space defined between both super-conducting coils is increased, and accordingly, the magnetic flux passes through the super-conducting coils themselves so as to increase the magnetic field strength, resulting in difficulty in maintaining a super-conductive state.

Accordingly, a conventional configuration was proposed wherein a disc-like ferromagnetic element is arranged between a superconducting main coil and a super-conducting shield coil so as to allow magnetic flux passing through a space defined between both super-conducting coils to concentrate to the ferromagnetic element in order to reduce the magnetic flux passing through the superconducting coils (Refer to JP-A-2001-224571, JP-A-2003-512872, JP-A-11-318858 and JP-A-11-283823).

However, since the ferromagnetic element arranged between the super-conducting main coil and the super-conducting shield coil has been conventionally disc-like, it is used in a zone having an unsaturated magnetic density, that is, it is used in an unsaturated condition. Should the ferromagnetic element be unsaturated, the magnetization characteristic curves would become uneven, thereby requiring adjustment to maintain the uniformity of the magnetic field.

For example, a technical document "R. M. Bozorth: Ferromagnetism (D. Van Nostrand. Princeton, N.J., 1951), p 849) discloses such a matter that a demagnetizing factor of about 0.01 (1/100) is obtained if the diameter D of the ferromagnetic element is about 10 times as large as the thickness T of the ferromagnetic element (that is, D/T =10). It is noted here that the demagnetizing factor of about 0.01 exhibits that the magnetization in the ferromagnetic element is decreased by 0.01 times, and accordingly, the ferromagnetic element falls in an unsaturated condition.

Explanation will be hereinbelow made of the reason why adjustment for the uniformity of the magnetic field is difficult when the ferromagnetic element falls in an unsaturated condition. The magnetization characteristic curve (BH curve) of a ferromagnetic element is as shown in FIG. 3 in which the magnetic field H is taken along the abscissa while the magnetic flux density B is taken along the ordinate. The magnetic flux density B substantially correlates to the magnetization M. As clearly understood from FIG. 3, the magnetization (magnetic flux density B) varies as the magnetic field H varies in ranges from a point "a" to a point "d" and a point "d" to a point "f," at which the magnetization is unsaturated. Since the magnetization characteristic is uneven among materials, the adjustment for the uniformity of the magnetic field has to be made for every material to be used. A single adjustment cannot be made therefor, thus resulting in long adjustment time and the possibility that adjustment may not be possible. Meanwhile, in the case of the adjustment for the uniformity of the magnetic field in a saturated range in which the magnetic flux density is maintained to be substantially constant even through the magnetic field varies, the unevenness of the magnetization characteristic is less among materials, and accordingly, adjustment for the uniformity of the magnetic field may be facilitated.

SUMMARY OF THE INVENTION

The present invention is devised in order to attain such a task that the effect of unevenness among magnetization characteristics of ferromagnetic elements which are arranged between the super-conducting main coils and the super-conducting shield coils is minimized.

In order to achieve the above-mentioned task, according to the present invention, there is provided a configuration comprising a pair of super-conducting main coils arranged being opposed to each other and interposing therebetween a zone to be observed, a pair of super-conducting shield coils arranged coaxially with the super-conducting main coils, being separated from the latter, on opposite sides of the zone to be observed, and ferromagnetic elements each located in a part of a space defined between an air core part of the super-conducting main coil and an air core part of the associated super-conducting shield coil, characterized in that the super-conducting shield coils have an outer diameter which is larger than that of the superconducting main coils. Each of the ferromagnetic elements is composed of a plurality of ferromagnetic members which are axially symmetric and coaxially arranged, and having, at least in a radial part thereof, a space between a center axis member and a radial member. In other words, the ferromagnetic element has a projected plane that is perpendicular to the center axis of the superconducting main coil and which has a zone where no ferromagnetic members are present, except around the center axis.

According to the present invention, the ferromagnetic element arranged in a part of the space extending from the super-conducting main coil to the super-conducting shield coil is divided into a plurality of ferromagnetic members, and is formed in at least a radial part thereof with a space. By adjusting a number of division and dimensions of the space, a ratio D/T between the diameter D and the thickness T of each of the ferromagnetic members may be decreased. As a result, the magnetization of the ferromagnetic members may be increased, and accordingly, the ferromagnetic members may be saturated. Thus, the effect of unevenness among the magnetization characteristics of the ferromagnetic members may be reduced. Therefore, it is possible to simplify the adjustment for the uniformity of the magnetic field.

Further, in conventional systems, magnetic flux induced on the side of a zone to be observed, remote from a ferromagnetic element which is arranged between a super-conducting main coil and a super-conducting shield coil, passes, being concentrated, through the ferromagnetic element, and accordingly, the magnetic flux in the ferromagnetic element has a main component in a radial direction. As a result, in comparison with an axial magnetic pressure acting upon the observable zone side of the ferromagnetic element, an axial magnetic pressure acting upon the other side becomes less, and accordingly, a powerful magnetic attracting force results between the pair of opposed ferromagnetic elements. However, in the present invention, the ferromagnetic element may be magnetically saturated, and accordingly, a difference between an axial magnetic intensity acting upon the zone to be observed side of the ferromagnetic element and an axial magnetic intensity acting upon the opposite side is small so that a magnetic attracting force resulting between the pair of ferromagnetic elements also becomes small. Thus, a support member for the ferromagnetic element may be simplified. Further, the member may have a small size, thereby it is possible to enhance the working efficiency.

In the above-mentioned case, the maximum diameter of the ferromagnetic element according to the present invention is larger than the super-conducting shield coil, but may be smaller than that of the superconducting shield coil. Further, the ferromagnetic element according to the present invention may be composed of a disc-like ferromagnetic member located in the center axial part, and at least one ring-like ferromagnetic member arranged on the outer peripheral side of the disc-like ferromagnetic member, being spaced therefrom. Instead, it may be composed of a plurality of ring-like ferromagnetic members which are coaxially arranged being spaced from one another.

Further, the ferromagnetic element according to the present invention may be composed of a ring-like first ferromagnetic element arranged in the air core part of the super-conducting main coil, a disc-like or ring-like second ferromagnetic member having an outer diameter smaller than the inner diameter of the first ferromagnetic element and arranged between the super-conducting main coil and the super-conducting shield coil, and a ring-like third ferromagnetic member having an inner diameter larger than the outer diameter of the second ferromagnetic member and an outer diameter smaller than the inner diameter of the super-conducting shield coil. In this case, the second ferromagnetic member is formed on its surface on the observable zone side with coaxial concavities and convexities. With this configuration, by adjusting the shapes of the concavities and convexities, it is possible to further simplify the adjustment for the uniformity of the magnetic field.

According to the present invention, the result of unevenness among magnetization characteristics of the magnetic elements located between the superconducting main coils and the super-conducting shield coils can be decreased.

Explanation will be hereinbelow made of embodiments of the present invention with reference to the accompanying drawing.

Other objects, features and advantages of the invention will become apparent from the following description of the embodiments of the invention taken in conjunction with the accompanying drawings.

DESCRIPTION OF THE PREFERRED EMBODIMENTS OF THE INVENTION

Embodiment 1

Figure 1:
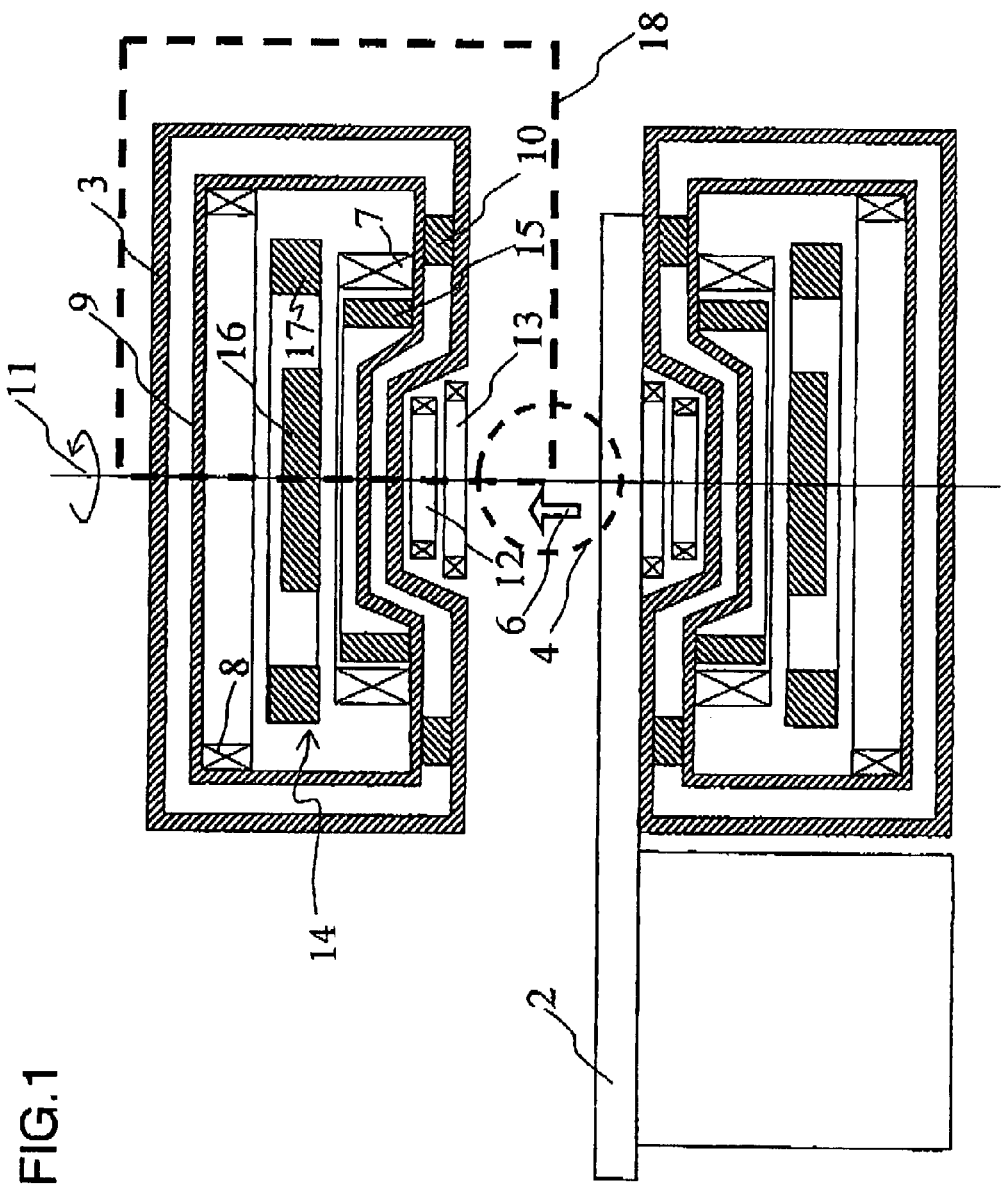
FIG. 1 is a sectional view illustrating a configuration of a super-conducting apparatus in an embodiment of the present invention.
Figure 2:
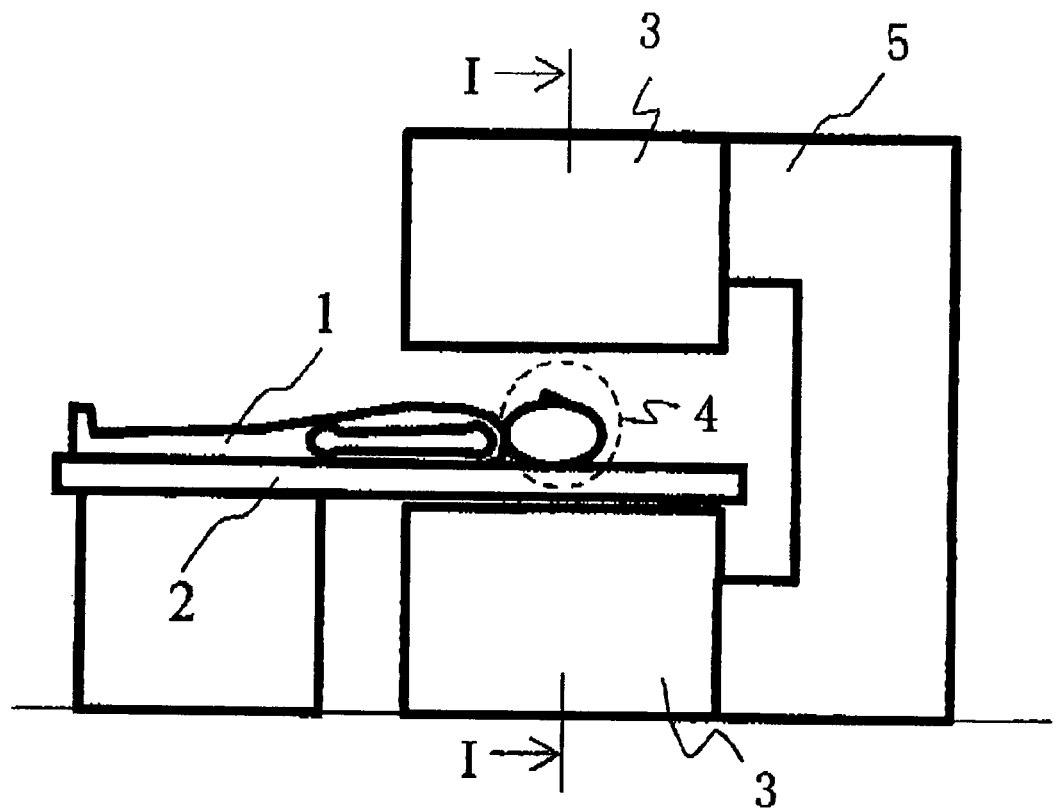
FIG. 2 is an external entire view illustrating an MRI system in an embodiment in which the super-conducting apparatus is applied.
Figure 3:
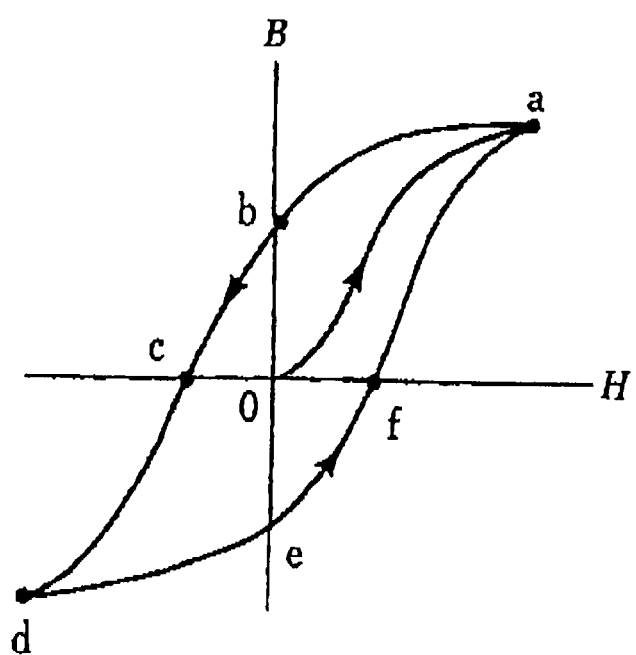
FIG. 3 is a view illustrating a magnetization characteristic curve of a ferromagnetic element.

FIG. 1 is a sectional view illustrating configuration of a super-conducting magnet apparatus in an embodiment of the present invention, and FIG. 2 is an external view illustrating an overall MRI system in an embodiment in which the super-conducting magnet apparatus is applied.

As shown in FIG. 2, the MRI system is composed of a pair of vacuum vessels each of which accommodates therein a static magnetic field generating source composed of a super-conducting main coil and the like and between which a zone 4 to be observed is interposed. The pair of vacuum vessels are connected with each other by a pillar 5. In the thus configured MRI system, a test object 1 is laid sidelong on a bed 2 and is conveyed through between the pair of vacuum vessels 3 so as to pre-position an image pick-up area which is therefore aligned with the zone 4 to be observed. It is noted that the MRI system shown in FIG. 2 has an opened space around a test object and accordingly is called an opened type MRI system.

FIG. 1 is a sectional view along line I-I in FIG. 2. It is noted the bed 2 is laid in a direction different from that shown in FIG. 2, which is an example for the purpose of reference. As shown in FIG. 1, each vacuum vessel 3 incorporates therein a superconducting coil 7 for generating a magnetic field in a direction 6, and a super-conducting shield coil 8 through which a current reverse to that through the super-conducting main coil 7 is fed in order to suppress a static magnetic leakage field. The superconducting main coil 7 and the super-conducting shield coil 8 are set in a cooling container 9 in which liquid helium for maintaining the super-conducting coils at a very low temperature is filled. Further, the cooling container 9 is supported to the vacuum vessel 3 through the intermediary of a heat-insulating support member 10 so as to restrain thermal penetration through the wall of the vacuum vessel 3. Further, the structures in both vacuum vessels 3 are arranged, substantially axially symmetric with each other with respect to an axis 11 and interpose therebetween the zone 4 to be observed. Moreover, the vacuum vessel 3 and the cooling container 9 are made of, for example, stainless steel, and the heat insulating support member 10 is made of, for example, fiber-reinforced plastic (FRP).

Further, in order to apply special position data to an NMR signal, an angled magnetic field coil 12 for applying an angled magnetic field in orthogonal three axial directions is arranged in the vacuum vessel 3 on the zone 4 to be observed side. Further, a high frequency irradiation coil 13 for applying a resonant frequency electromagnet wave which induces an NMR phenomenon is arranged on the zone 4 side of the angled magnetic field coil 12.

The super-conducting magnet apparatus in this embodiment is configured substantially around the axis 11. As shown, a pair of the super-conducting main coils 7 are arranged interposing therebetween the zone 4 to be observed, and a pair of the super-conducting shield coils 8 are arranged interposing therebetween the zone 4 to be observed, on the axes of the superconducting main coils 7, being opposed to and separated from the pair of the super-conducting main coils 7 on the side remote from the zone 4 to be observed. The super-conducting shield coils 8 have an outer diameter which is greater than that of the super-conducting main coils 7. Further, in this embodiment, the superconducting shield coils 8 have an inner diameter which is larger than the outer diameter of the super-conducting main coils 7.

In particular, in this embodiment, a ferromagnetic element 14 composed of a first ferromagnetic member 15, a second ferromagnetic member 16 and a third ferromagnetic member 17 which are formed around the axis is provided in a part of a space extending from the super-conducting main coil 7 to super-conducting shield coil 8. The first ferromagnetic member 15 is formed in a ring-like shape having an outer diameter which is smaller than the inner diameter of the super-conducting main coil 7, and is arranged in an air core part of the super-conducting main coil 7, near to the inner surface of the latter. The second ferromagnetic member 16 is formed in a disc-like shape having an outer diameter which is smaller than the inner diameter of the first ferromagnetic member 15, and having a height which is located between the super-conducting main coil 7 and super-conducting shield coil 8. The third ferromagnetic member 17 is formed in a ring-like shape having an inner diameter which is larger than the outer diameter of the second ferromagnetic member 16 and an outer diameter smaller than the inner diameter of the super-conducting shield coil 8. These first to third ferromagnetic members 15, 16, 17 are preferably made of ferrite, and are accommodated in the cooling container 9 together with the super-conducting main coil 7 and the super conducting shield coil 8.

With this configuration, according to this embodiment, a desired static magnetic field is induced in the zone 4 to be observed by the pair of superconducting main coils 7. Further, magnetic flux induced on the side of the pair of super-conducting main coils 7 remote from the zone 4 to be observed is bent in a direction orthogonal to the axis 11 by being blocked by reverse magnetic flux induced by the pair of super-conducting shield coils 8. The thus bent magnetic flux pass radially and mainly through the second ferromagnetic member 16 and the third ferromagnetic member 17, and then passes on a route from a space defined between the super-conducting main coil 7 and the super-conducting shield coil 8 to the cooling container 9 and the vacuum vessel 3. The magnetic flux passing through the space defined between the super-conducting main coil 7 and the superconducting shield coil 8 passes through the third ferromagnetic member 17 having a high magnetism, and accordingly, is restrained in order to maintain a super-conductive state of the super-conducting coils.

In particular, this embodiment is characterized in that the ferromagnetic element 14 provided in a part of the space extending from the super-conducting main coil 7 to the super-conducting shield coil 8 is divided into the disc-like second ferromagnetic member 16 and the ring-like third ferromagnetic member 17, the outer diameter of the second ferromagnetic member 16 being smaller than the inner diameter of the third ferromagnetic member 17 so as to define therebetween a space.

With this configuration, a ratio D/T between the diameter D and the thickness T of the disc-like second ferromagnetic member 16 is smaller than that of the conventional one, its magnetic saturation may be facilitated. Accordingly, the time of adjustment for the uniformity of the magnetic field caused by unevenness among magnetization characteristics of materials can be prevented from being greatly increased.

Further, since the second ferromagnetic member 16 is saturated, a difference in magnetic flux density (magnetization) between the side facing the zone 4 to be observed of the ferromagnetic member 16 and the side remote from the zone 4 to be observed. As a result, the magnetic attraction force resulting between the pair of the upper and lower ferromagnetic members 16 becomes correspondingly smaller. Thereby, it is possible to simplify the configuration of the support member for the ferromagnetic member 16.

Further, since the ring-like ferromagnetic member 17 is located in the same plane as that of the second ferromagnetic member 16, outside of the latter, the magnetic flux which is concentrated by the second ferromagnetic member 16 passes smoothly through the third ferromagnetic member 17, and accordingly, the magnetic flux passing through the super-conducting main coil 7 and the super-conducting shield coil 8 is restrained so as to maintain the super-conductive state of the super-conducting coils. It is noted that the ratio D/T of the third ferromagnetic member 17 is considered to be equivalently obtained in such a way that it is radially divided into several segments and then integrated. The ratio D/T of the third ferromagnetic member 17 is sufficiently smaller than that of a conventional one. Thus, it is clear that the magnetic saturation of the third ferromagnetic member 17 may be facilitated.

As stated above, according to the present invention, since the ferromagnetic element 14 is divided into the disc-like second ferromagnetic member 16 and the ring-like third ferromagnetic member 17, and since the outer diameter of the second ferromagnetic member 16 is set to be smaller than the inner diameter of the third ferromagnetic member 17, the ferromagnetic members 16, 17 may be magnetically saturated. As a result, in a saturated zone where the magnetic flux density B is substantially constant with less unevenness among magnetization characteristic curves of materials, the uniformity of the magnetic field may be adjusted. As a result, the adjustment for the uniformity of the magnetic field may be facilitated, and the time of the adjustment may be shortened. Thereby it is possible to eliminate the problem resulting from maladjustment.

Next, explanation will be made of the first ferromagnetic member 15 which is a forth feature, and which is arranged in the air core part of the super-conducting main coil 7, near to the inner surface of the latter. The magnetic flux passing through the air core part of the super-conducting main coil 7 passes through the first ferromagnetic member 15, being concentrated, and accordingly, the magnetic force lines passing through the super-conducting main coil 7 may be prevented from being increased in association with an increase in the magnetic field intensity.

Further, with the provision of the space between the second and third ferromagnetic members 16, 17, although there would be caused such a risk that the magnetic force lines from the air core part of the super-conducting main coil 7 to the third ferromagnetic member 17 through the super-conducting main coil 7 are increased, an increase of the magnetic force lines passing through the super-conducting main coil 7 may be restrained since the first ferromagnetic member 15 is arranged in that part.

Further, the magnetic field intensity in a part around the zone 4 to be observed, corresponding to the position of the first ferromagnetic member 15 may be increased. As a result, deviation in the distribution of the magnetic field intensity may be improved so as to enhance the uniformity of the magnetic field, and accordingly, a current fed to the super-conducting main coil 7, corresponding to a desired magnetic field intensity in the zone 4 to be observed may be reduced.

Further, according to this embodiment, since the ferromagnetic element 14 is divided into a plurality of ferromagnetic members, each of the ferromagnetic members may have a reduced weight, and accordingly, the ferromagnetic element itself may have a reduced weight. Thereby it is possible to enhance the efficiency of the assembly work thereof.

Embodiment 2

Figure 4:
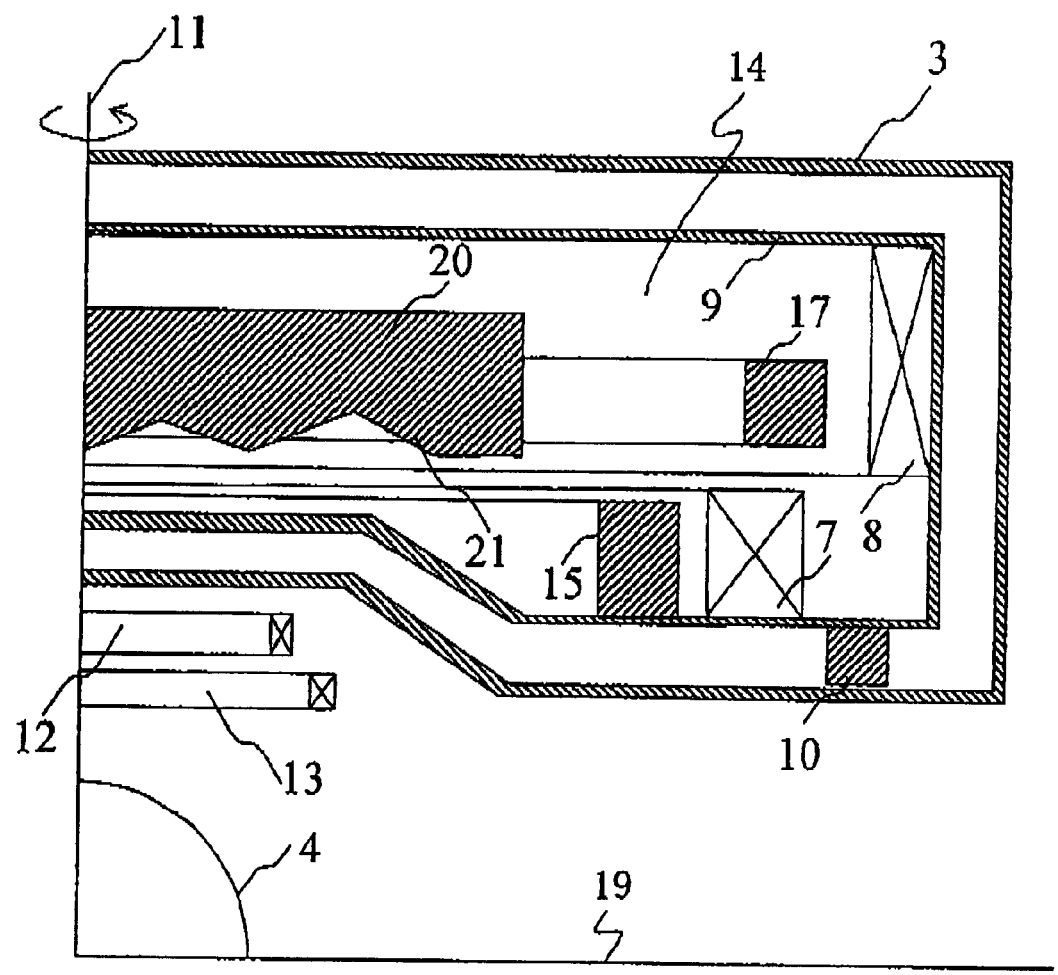
FIG. 4 is a sectional view which shows a configuration of a super-conducting apparatus in another embodiment of the present invention.

FIG. 4 is a sectional view illustrating a configuration of a super-conducting magnet apparatus in another embodiment of the present invention. It is noted that FIG. 4 is an enlarged view which shows a part corresponding to the part surrounded by a dotted line 18 in FIG. 1. This embodiment has the same configuration as that shown in FIG. 1, except that a second ferromagnetic member 20 is used instead of the second ferromagnetic member 16, and the second ferromagnetic member 20 and the third ferromagnetic number 17 are included within the air core part of the super-conducting shield coil 8 while the superconducting shield coil 8 has different dimensions and a shifted axial position. Thus, like reference numerals are used to denote like parts to those shown in FIG. 1 so as to omit the explanation thereto.

As shown, the second ferromagnetic member 20 is disc-like, having an outer diameter smaller than the inner diameter of the first ferromagnetic member 15, being preferably made of ferrite, and is arranged in the air core part of the super-conducting shield coil 8. In particular, concentric concavities and convexities 21 are formed on the disc surface of the second ferromagnetic member 20 on the zone 4 side.

According to this embodiment, technical effects and advantages which are the same as those obtained by the embodiment shown in FIG. 1 may be obtained, and further, with the provision of the concavities and convexities 21 to the second ferromagnetic member 20 on the zone 4 side, the adjustment for the uniformity of the magnetic field may be further facilitated.

Embodiment 3

Figure 5:
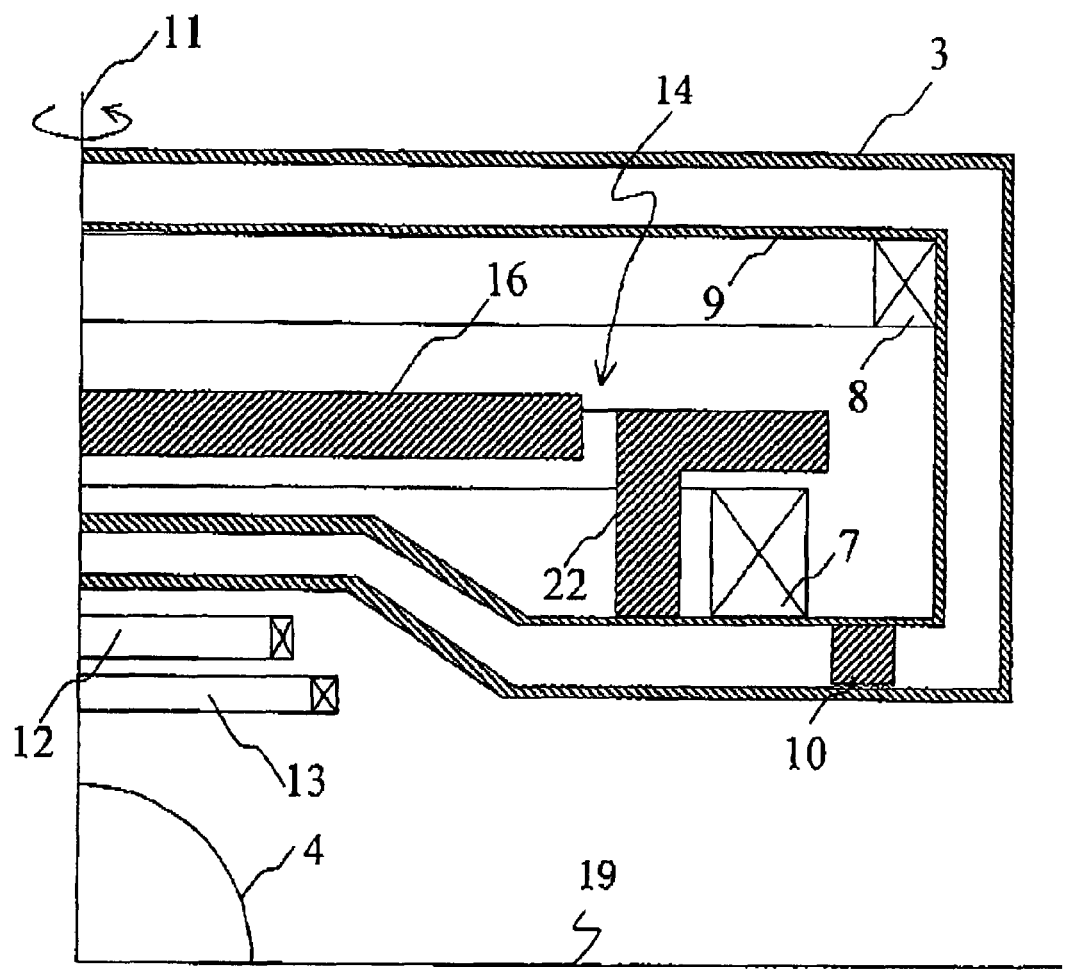
FIG. 5 is a sectional view which shows a configuration of a super-conducting apparatus in further another embodiment of the present invention.

FIG. 5 is a sectional view which shows a configuration of a super-conducting magnet apparatus in a further embodiment of the present invention. As is similar to FIG. 4, it is noted that FIG. 5 is an enlarged sectional view which shows a part corresponding to the part surrounded by the dotted line 18 in FIG. 1 and which has an outer diameter smaller than the inner diameter of the super-conducting main coil. This embodiment has a configuration the same as that of the embodiment shown in FIG. 1, except that the first ferromagnetic member 15 and the third ferromagnetic member 17 as shown in FIG. 1 are joined together so as to form a single ferromagnetic member 22. That is, the ferromagnetic member 22 has a cylindrical part arranged in the air core part of the super-conducting main coil 7 and a ring-like flange part which overhangs from an end part of the cylindrical part on the super-conducting shield coil 8 side to a position between the super-conducting main coil 7 and the super-conducting shield coil 8. Accordingly, like reference numerals are used to denote like parts to those shown in FIG. 1 in order to omit explanation thereto.

According to this embodiment, technical 25 effects and advantages the same as those obtained by the embodiment shown in FIG. 1 may be obtained. Further, since the positions where the first ferromagnetic element 15 and the third ferromagnetic element are located are adjacent to the superconducting main coil 7 and the super-conducting shield coil 8, respectively, the positions are inherent to easy magnetic saturation. Thus, although they are joined together so as to obtain the large-sized ferromagnetic member 22, the ferromagnetic member 22 may be magnetized so as to attain the object of the present invention.

Embodiment 4

Figure 6:
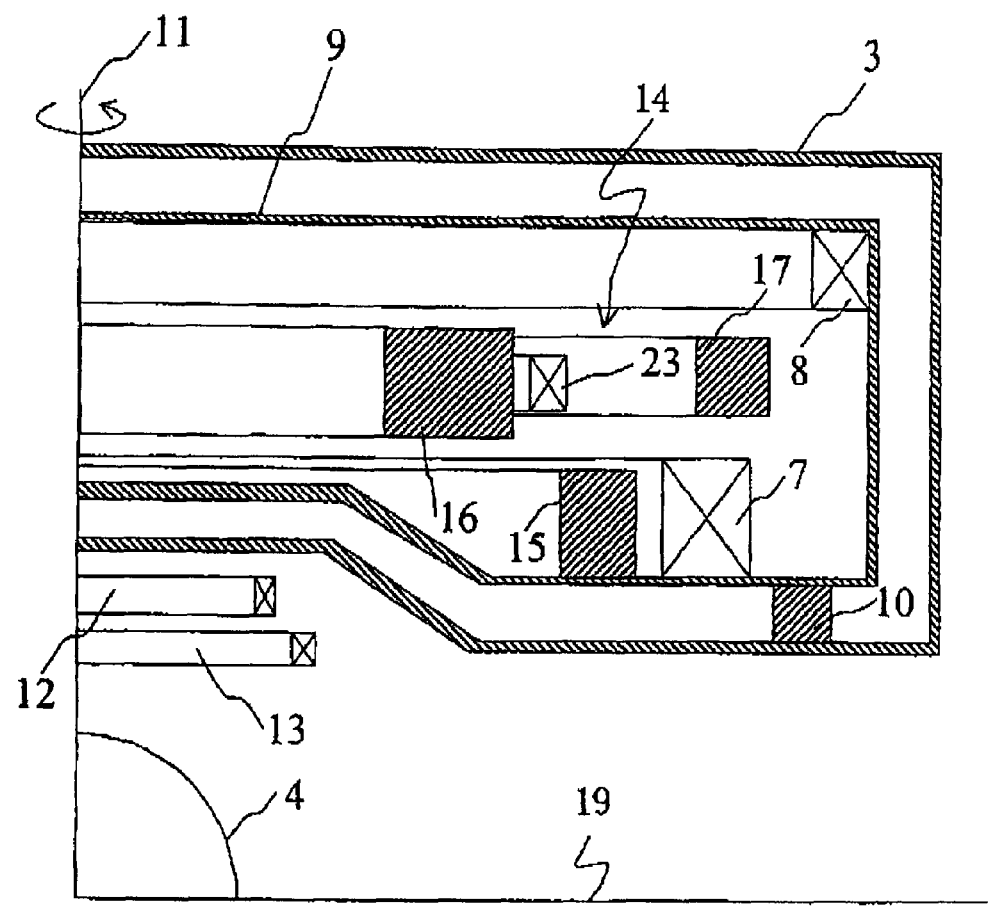
FIG. 6 is a sectional view which shows a configuration of a super-conducting apparatus in further another embodiment of the present invention.

FIG. 6 is a sectional view which shows a configuration of a super-conducting magnet apparatus in a further embodiment of the present invention. It is noted, similar to FIG. 4, that FIG. 6 is an enlarged view which shows a part corresponding to the part surrounded by the dotted line 18. This embodiment has a configuration the same as that of the embodiment shown in FIG. 1, except that a super-conducting coil 23 which is concentric with the second ferromagnetic member 16 is arranged outside of the ferromagnetic member 16.

According to this embodiment, technical effects and advantages the same as those obtained by the embodiment 1 may be obtained. Further, with the provision of the super-conducting coil 23 outside of the second ferromagnetic member 16, there may be obtained such an advantage that the magnetic saturation may be further facilitated in comparison with the other embodiments. In particular, a difference in magnetic field density between the zone 4 side of the second ferromagnetic member 16 and the side remote from the zone 4 side may be decreased, thereby it is possible to reduce the magnetic attraction force resulting between the pair of the second ferromagnetic members 16.

Further, the configuration of the superconducting coil 23 should not be limited to that shown in FIG. 6, but there may be used such a configuration that a pair of upper and lower super-conducting coils are arranged being opposed to each other, interposing therebetween the ring-like part of the ferromagnetic member 16, with currents reverse to each other being used in each coil, respectively, in order to promote the magnetic saturation of the second ferromagnetic member 16. With this configuration, there may be obtained technical effects and advantages obtained by the embodiment shown in FIG. 1.

Embodiment 5

Figure 7:
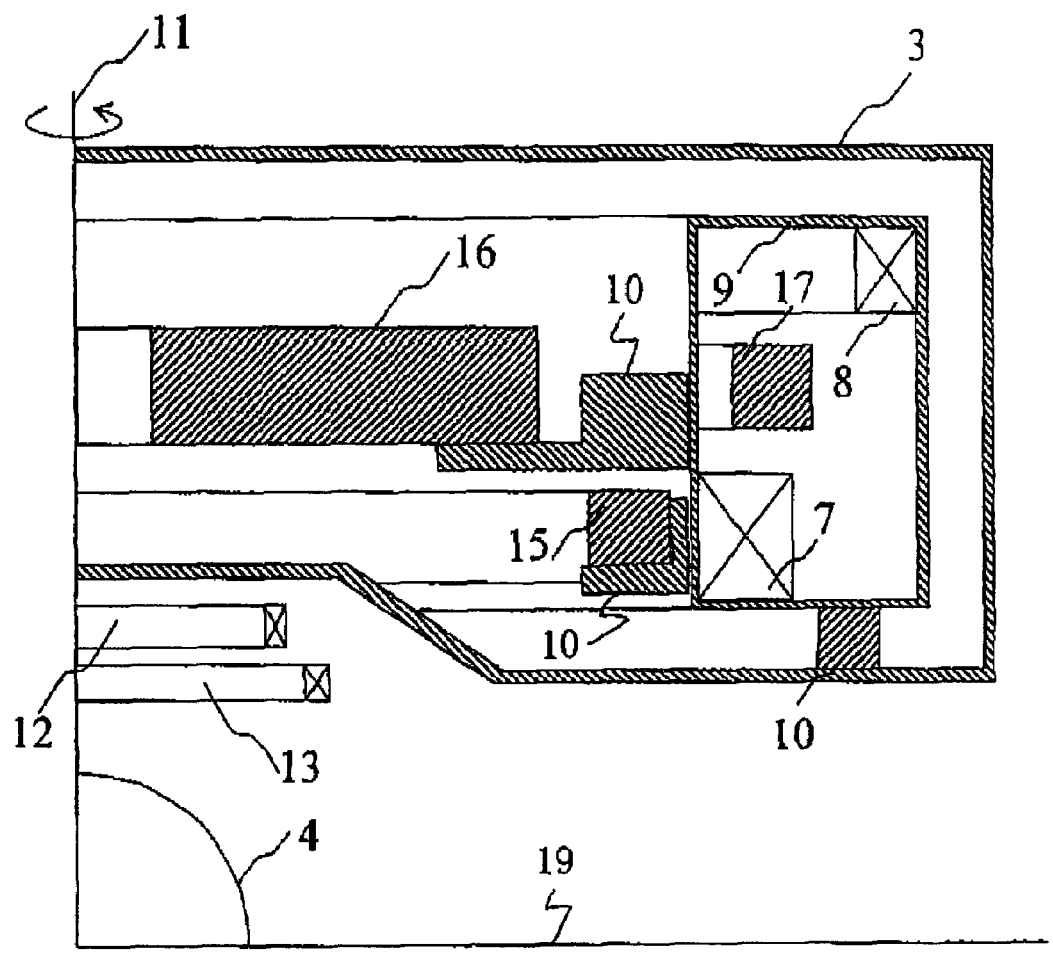
FIG. 7 is a sectional view which shows a configuration of a super-conducting apparatus in further another embodiment of the present invention.

FIG. 7 is a sectional view which shows a configuration of a super-conducting magnet apparatus in a further embodiment of the present invention. It is noted, similar to FIG. 4, that FIG. 5 is an enlarged view which shows a part corresponding to the part surrounded by the dotted line 18 in FIG. 1. This embodiment has a configuration which is the same as that of the embodiment shown in FIG. 1, except that the cooling container 9 is ring-like, and accommodates therein the super-conducting main coil 7, the super-conducting shield coil 8 and the third ferromagnetic member 17, excluding the first and second ferromagnetic members 15, 16, outside therefrom. Even though the first and second ferromagnetic members 15, 16 are arranged outside of the cooling container 9 having a very low inside temperature, there is no substantial effect on the magnetization characteristics of the ferromagnetic members 15, 16, and accordingly, technical effects and advantages which are the same as those obtained by the embodiment shown in FIG. 1 may be obtained.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A super-conducting magnet apparatus in a MRI system comprising a pair of super-conducting main coils interposing therebetween a zone to be observed and being opposed to each other, a pair of super-conductive shield coils arranged coaxially with the pair of super-conductive main coils, being separated from the latter and arranged on opposite sides of the zone to be observed, and ferromagnetic elements arranged in parts of spaces extending from air core parts of the super-conducting main coils to air core parts of the super-conductive shield coils, the super-conductive shield coils having an outer diameter larger than that of the super-conducting main coils, wherein the ferromagnetic element is comprised of a plurality of axially symmetric ferromagnetic members which are coaxially arranged with a space between a center axis member that includes a disc-like part and one or more coaxially-arranged cylindrical parts projecting from the disc-like part and a ring-like radial member.

2. A super-conducting apparatus in a MRI system as set forth in claim 1, characterized in that the ferromagnetic element has a maximum diameter which is larger than the outer diameter of the super-conducting main coils but smaller than outer diameter of the super-conductive shield coils.

3. A super-conducting apparatus in a MRI system as set forth in claim 1, characterized in that the ring-like radial member is arranged on the outer peripheral side of the center axis member with a space therebetween.

4. A super-conducting apparatus in a MRI system as set forth in claim 1, characterized in that the ring-like radial member is comprised of a plurality of ring-like ferromagnetic members which are coaxially arranged, being radially spaced from one another.

5. A super-conducting apparatus in a MRI system as set forth in claim 1, characterized in that the ferromagnetic element is comprised of a ring-like first ferromagnetic member arranged in the air core part of the super-conducting main coil, the center-axis member having an outer diameter smaller than the inner diameter of the first ferromagnetic member and arranged between the super-conducting main coil and the super-conductive shield coil, and the radial member having an inner diameter larger than the outer diameter of the center axis member and an outer diameter smaller than the inner diameter of the super-conductive shield coil.

6. A super-conducting apparatus in a MRI system as set forth in claim 5, characterized in that the center axis member is formed on its surface on the zone (to be observed) side with concentric concavities and convexities.

7. A super-conducting apparatus in a MRI system as set forth in claim 1, characterized in that the ferromagnetic element is comprised of the radial member having a cylindrical part arranged in the air core part of the super-conducting main coil, the cylindrical part having a first end directed towards the super-conductive shield coil, and a disc-like flange part extending outwards from the first end of the cylindrical part to a position between the outer diameter of the super-conducting main coil and the inner diameter of the super-conductive shield coil, and the center axis member having an outer diameter smaller than an inner diameter of the radial member, and arranged between the super-conducting main coil and the super-conductive shield coil.

* * * * *